(12) United States Patent
Chong

(10) Patent No.: US 7,262,631 B2
(45) Date of Patent: Aug. 28, 2007

(54) METHOD AND APPARATUS FOR CONTROLLING A VOLTAGE LEVEL

(75) Inventor: Yew Keong Chong, New Braunfels, TX (US)

(73) Assignee: ARM Limited, Cambridge (GB)

( * ) Notice: Subject to any disclaimer, the term of this patent is extended or adjusted under 35 U.S.C. 154(b) by 76 days.

(21) Appl. No.: 11/102,881

(22) Filed: Apr. 11, 2005

(65) Prior Publication Data
US 2006/0226869 A1  Oct. 12, 2006

(51) Int. Cl.
*H03K 17/16* (2006.01)
*H03K 19/003* (2006.01)

(52) U.S. Cl. .................. 326/33; 326/112; 326/119

(58) Field of Classification Search .................. 326/17, 326/33, 95–98, 112, 119, 121
See application file for complete search history.

(56) References Cited

U.S. PATENT DOCUMENTS

| | | | |
|---|---|---|---|
| 5,332,929 A | 7/1994 | Chiang | |
| 5,959,927 A | 9/1999 | Yamagata et al. | |
| 6,049,245 A | * 4/2000 | Son et al. | 327/544 |
| 2002/0000873 A1 | * 1/2002 | Tanizaki et al. | 327/546 |
| 2003/0102904 A1 | 6/2003 | Mizuon et al. | |
| 2006/0091913 A1 | * 5/2006 | Bhattacharya | 326/97 |

\* cited by examiner

*Primary Examiner*—Anh Q. Tran
(74) *Attorney, Agent, or Firm*—Nixon & Vanderhye P.C.

(57) ABSTRACT

A voltage level control device operable to control a voltage level supplied from a first voltage level source to circuitry, said circuitry being arranged between said first voltage level source and a second voltage level source, said first and second voltage level sources being operable to output different voltage levels; said voltage level control device comprising: a power transistor operable to be connected between said first voltage level source and said circuitry, said power transistor comprising a sleep signal input operable to receive a sleep signal; a switching device arranged in parallel with said power transistor and comprising a sleep signal input operable to receive a pseudo sleep signal; wherein said voltage level control device is operable in dependence upon said sleep signal and said pseudo sleep signal to output to said circuitry an output voltage said output voltage comprising one of three voltage levels, said three voltage levels lying between voltage levels output by said first and second voltage sources.

17 Claims, 4 Drawing Sheets

METHOD AND APPARATUS FOR CONTROLLING A VOLTAGE LEVEL

BACKGROUND OF THE INVENTION

1. Field of the Invention

The present invention relates to the field of data processing and in certain preferred embodiments to the field of voltage level control.

2. Description of the Prior Art

Many data processing circuits burn power even when they are not doing anything, this is referred to as static power leakage. Static power leakage is a particular problem in circuits where the components are manufactured to be as small as possible. To reduce power leakage, many circuit designs are now making use of power gating which helps reduce power leakage during sleep mode. This power gating is achieved by inserting power transistors between any circuit element and Vdd creating a "virtual" Vdd rail, or by inserting power transistors between any circuit element and Vss creating a "virtual" Vss rail. These transistors are placed in series with the circuit either between the high voltage rail Vdd and the circuit or between the low voltage rail Vss (usually ground) and the circuit.

FIG. 1A shows an NMOS power transistor connected between the lower voltage rail Vss, usually ground and some circuitry. FIG. 1B shows an alternative where a PMOS power transistor is connected between the higher voltage rail Vdd and the circuitry. Generally during active mode the transistors of FIGS. 1A and 1B are turned on and they are conducting. Thus, almost the entire voltage difference Vdd–Vss falls across the circuitry. To enter a low leakage or sleep mode, the power transistors 10, 15 are turned off in response to a sleep signal and the leakage of the circuit is then limited by the leakage of the power transistors. Since the power transistors can be made to be high Vt (threshold voltage) or thick oxide devices, and since the width of the power transistors can be much less than the total width of the active devices in the design, leakage currents can be dramatically reduced. However, when the power transistors are turned off the virtual power rail at their output floats to approximately that of the other power rail and as a result of this a loss of state is experienced within the circuitry.

In order to overcome this problem, data retention circuitry such as data retention flops can be used within the design. A disadvantage of this is that such data retention components require circuit area and a redesign of any standard cell latches.

One other known way of addressing this problem is with the use of a diode placed in parallel with the power transistor. This diode is arranged such that when the power transistor is turned off, its output starts to float and when it reaches a value large enough to overcome the forward bias voltage of the diode, the diode starts to conduct, thus the voltage is clamped at the forward bias voltage of the diode. A drawback of this is that diodes only turn on at 0.7 V which may be too high a voltage to save data in some circuits.

Further data processing apparatus in this field are disclosed in http://www.imec.be/esscirc/ESSCIRC2002/presentations and http://konteret.webmaster.se/dockeeperfiles/340/998/DrazdziulisM.pdf

SUMMARY OF THE INVENTION

A first aspect of the present invention provides a voltage level control device operable to control a voltage level supplied from a first voltage level source to circuitry, said circuitry being arranged between said first voltage level source and a second voltage level source, said first and second voltage level sources being operable to output different voltage levels; said voltage level control device comprising: a power transistor operable to be connected between said first voltage level source and said circuitry, said power transistor comprising a sleep signal input operable to receive a sleep signal; at least one switching device arranged in parallel with said power transistor and comprising at least one sleep signal input operable to receive at least one pseudo sleep signal; wherein said voltage level control device is operable in dependence upon said sleep signal and said at least one pseudo sleep signal to output to said circuitry an output voltage said output voltage comprising one of at least three voltage levels, said at least three voltage levels lying between voltage levels output by said first and second voltage sources.

The introduction of power transistors that allow a circuit to be put into a sleep mode has reduced the problem of static power loss but has introduced a new problem of data loss. The voltage level control device of the present invention recognises the conflicting problems of power loss and data loss and addresses these problems in a simple and elegant fashion by providing at least one additional switching device in parallel with the power transistor, the switching device(s) being provided with their own sleep input(s). The provision of this additional switching device(s) with additional control input means that at least three different voltage levels can be output by the voltage level control device. Thus, the potential difference across circuitry can be set by this device to be one of at least three values, the largest potential difference being chosen for active mode, the lowest potential difference being chosen for sleep mode, and additional intermediate potential difference(s) being provided which can be used for "pseudo sleep" mode(s). In pseudo sleep mode the voltage across the circuit is reduced thus, power loss is reduced. However there is still a sufficient voltage across the circuit to avoid or at least reduce data loss. This mode can be particularly useful for situations where circuitry is inactive for a short period.

In some embodiments said at least three voltage levels comprise a first voltage level substantially equal to or approaching said voltage level of said first voltage source a second voltage level substantially equal to or approaching said voltage level of said second voltage source and at least one intermediate voltage level, said at least one intermediate voltage level lying between said first and second voltage levels.

By having the first and second voltage levels substantially equal to the voltage level of the voltage sources the voltage differences approaching the maximum and minimum possible can be achieved across the circuitry. These are appropriate for active and sleep mode respectively. At least one intermediate voltage level can be used and this is selected to be an appropriate level for reducing data loss while increasing power savings.

In preferred embodiments said voltage level control device comprises a switching device operable to receive a pseudo sleep signal and is operable: in response to said sleep signal having a first predetermined value to turn said power transistor on and to output said first voltage level; in response to said sleep signal having a second predetermined value to turn said power transistor off and in response to said pseudo sleep signal having a predetermined value to turn said switching device off and to output said second voltage level; and in response to said sleep signal having a second predetermined value to turn said power transistor off and in response to said pseudo sleep signal having a further predetermined value and following a voltage across said switching device reaching a threshold value of said switching device to turn said switching device on and to output said intermediate voltage level.

A sleep signals act to turn off the power transistor. Providing a switching device in parallel to the power transistor with a separate input for a pseudo sleep signal enables three different voltage levels to be output, depending on the values of the two sleep signals. This enables a sleep mode where power loss is very low but data is not retained, a pseudo sleep mode sufficient to retain at least some data while reducing power loss compared to an active mode where power loss may be relatively high and state is retained.

In some embodiments, said voltage level control device comprises at least one further switching device operable to receive a second pseudo sleep signal, said voltage level control device being operable: in response to said sleep signal having a first predetermined value to turn said power transistor on and to output said first voltage level; in response to said sleep signal having a second predetermined value to turn said power transistor off and in response to said pseudo and second pseudo sleep signals having predetermined values to turn said switching device off and to output said second voltage level; and in response to said sleep signal having a second predetermined value to turn said power transistor off and in response to said pseudo sleep signal having a further predetermined value and following a voltage across said switching device reaching a threshold value of said switching device to turn said switching device on and to output a first intermediate voltage level, and in response to said second pseudo sleep signal having a further predetermined value and following a voltage across said further switching device reaching a threshold value of said further switching device to turn said further switching device on and to output a second intermediate voltage level.

The provision of at least one further switching device in parallel allows the input of a second pseudo sleep signal to provide a further intermediate voltage level. The intermediate voltage levels depend on the threshold voltages of the switching devices and suitable switching devices can be selected to provide appropriate voltage levels. For example, it may be that devices in one portion of the circuit are such that they retain state with a relatively low voltage across them, while other devices may require a larger potential difference. Thus, depending where state needs to be retained an appropriate intermediate voltage level can be selected by using the pseudo sleep signals.

In preferred embodiments, the power transistor is an NMOS transistor and the first voltage level source is lower than the second voltage level source.

NMOS transistors are particularly suitable for power transistors and are often used, having a low area and low resistance.

Preferably, one of said at least one switching devices comprises a PMOS transistor, one of said at least one intermediate voltage levels depending on said threshold voltage of said PMOS transistor.

A PMOS transistor is suitable for use as a switch in conjunction with an NMOS transistor. A PMOS transistor forms a relatively small switching device and is also quite cheap to manufacture. Furthermore the threshold voltage of the PMOS transistor can (within limits) be selected by using appropriate $V_T$ masks. Thus, a suitable intermediate voltage that reduces power loss while ensuring data retention can be selected.

In some embodiments, said power transistor is a PMOS transistor and said first voltage level source is higher than said second voltage level.

Although PMOS transistors are generally not as popular as NMOS transistors for use as power transistors, being seen as weaker as they naturally have a higher resistance and therefore need to be bigger to produce a similar resistance to the NMOS transistors, they can in some circumstances be more suitable as power transistors. It should be noted that the higher resistance is si advantageous feature as far as power leakage is concerned.

In some embodiments, one of said at least one switching devices comprises an NMOS transistor, one of said at least one intermediate voltage levels depending on said threshold voltage of said NMOS transistor.

An NMOS transistor placed in parallel with a PMOS power transistor makes a convenient and efficient switching device.

In some embodiments said at least one switching device comprises at least one of the following a thick oxide, LVT, NVT or HVT device.

The actual choice of switching device depends on the process and circuitry being used and the desired threshold voltage level.

In some embodiments said at least one switching device comprises a plurality of transistors.

Although in some embodiments it is possible to produce a particularly simple and elegant device, with a single transistor in parallel with a power transistor, in other embodiments, a plurality of transistors may be used.

Although this device is suitable for use with different sorts of circuitry such as biCMOS, in preferred embodiments, said circuitry comprises CMOS circuitry.

This invention is particularly suited for use with CMOS circuitry. CMOS circuitry suffers from static power leakage and thus, anything that can reduce that is helpful. Furthermore, the fact that PMOS and NMOS transistors can be fabricated alongside the CMOS circuitry, makes such voltage level control devices particularly appropriate.

A further aspect of the present invention provides a method of controlling a voltage level supplied from a first voltage level source to circuitry, said circuitry being arranged between said first voltage level source and a second voltage level source, said first and second voltage level sources being operable to output different voltage levels, said method comprising; connecting a power transistor between said first voltage level source and said circuitry, said power transistor having a sleep signal input operable to receive a sleep signal; connecting at least one switching device in parallel with said power transistor, said at least one switching device having at least one sleep signal input operable to receive at least one pseudo sleep signal; outputting an output voltage to said circuitry in dependence upon said sleep signal and said at least one pseudo sloop signal, said output voltage comprising one of at least three voltage levels, said at least three voltage levels lying between voltage levels output by said first and second voltage sources.

A still further aspect of the present invention provides a means for controlling a voltage level supplied from a first means for supplying a voltage level to circuitry, said circuitry being arranged between said first means for supplying a voltage level and a second means for supplying a voltage level, said first and second means for supplying a voltage level being operable to output different voltage levels; said means for controlling a voltage level comprising: a power transistor operable to be connected between said first means for supplying a voltage level and said circuitry, said power transistor comprising a sleep signal input operable to receive a sleep signal; at least one means for switching arranged in parallel with said power transistor and comprising at least one sleep signal input operable to receive at least one pseudo sleep signal; wherein said means for controlling a voltage level is operable in dependence upon said sleep signal and said at least one pseudo sleep signal to output to said circuitry an output voltage said output voltage comprising one of at least three voltage levels, said at least three voltage levels lying between voltage levels output by said first and second means for supplying a voltage level.

BRIEF DESCRIPTION OF THE DRAWINGS

The present invention will be described further, by way of example only, with reference to preferred embodiments thereof as illustrated in the accompanying drawings, in which.

DESCRIPTION OF PREFERRED EMBODIMENTS

Figure 1A:
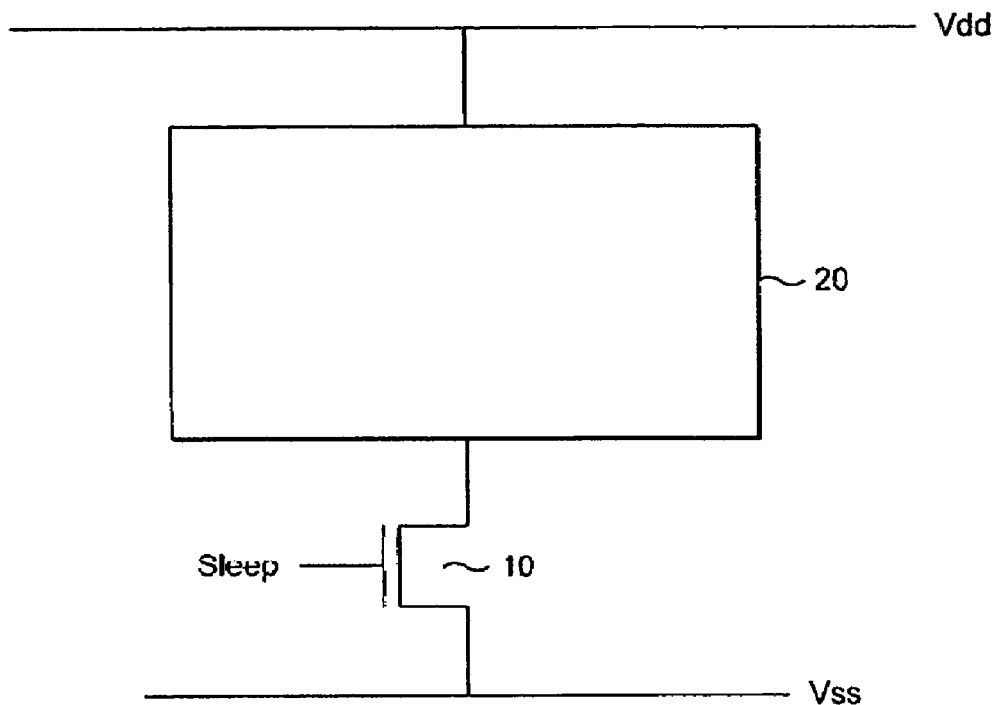
FIG. 1a shows a conventional circuit with an NMOS power transistor.
Figure 1B:
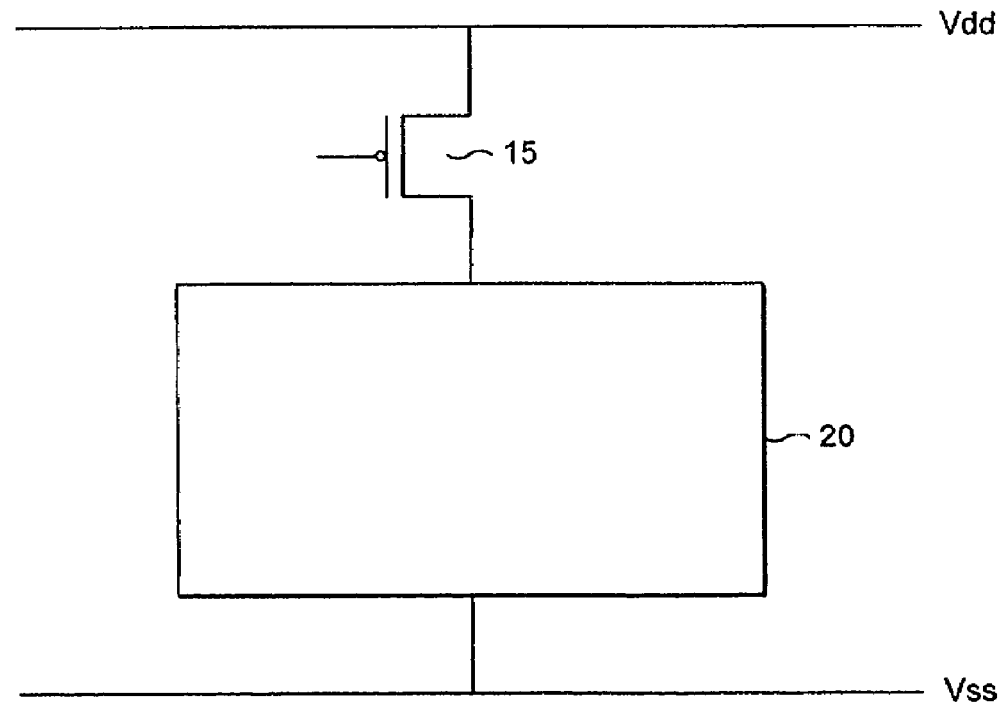
FIG. 1b shows a conventional circuit having a PMOS power transistor.
Figure 2:
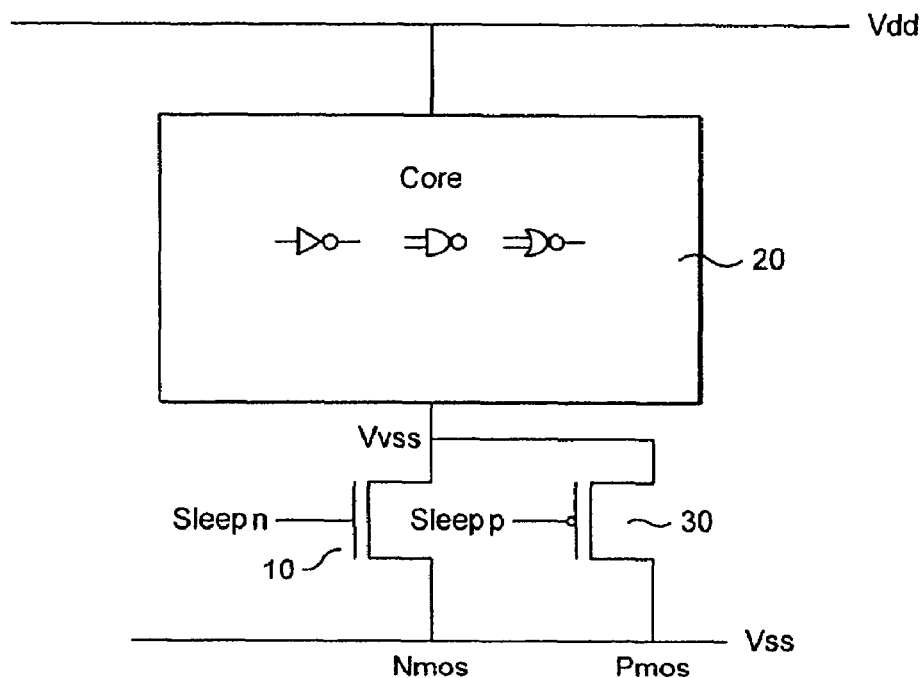
FIG. 2 shows a voltage level control device according to a first embodiment of the present invention.

FIG. 2 schematically shows a core of logic 20, which may comprise data storage elements, data processing elements and/or circuitry in general, powered by a high voltage rail Vdd and a low voltage rail Vss. The low voltage rail is generally held at ground. An NMOS power transistor 10 is connected between the core logic 20 and the lower voltage rails Vss. This NMOS power transistor 10 receives a sleep signal sleepn at its gate. When the sleepn signal is high, NMOS power transistor 10 is turned on and the voltage Vvss at its drain is approximately that of the lower voltage rail Vss i.e. it gives a virtual Vss to core logic 20. Thus, a high sleepn signal is in effect a no sleep signal and renders core logic 20 active. In this state, core logic 20 receives most of the voltage drop from between voltage rails Vdd and Vss, the voltage drop lost being that due to the voltage drop across the transistor due to its resistance when its on. This is designed to be small.

The voltage control device further comprises a PMOS transistor 30 arranged in parallel with the power transistor 10. When the power transistor is on, i.e. sleepn is high, the signal sleepp received at the gate of the PMOS transistor is not important as the virtual voltage Vvss will be held close to Vss by the power transistor itself. When, however, sleepn falls low, power transistor 10 is turned off and due to its high resistance compared to leakage through the core devices when it is off the voltage at the drain of the power transistor, Vvss starts to float up towards the voltage of the upper rail Vdd, at this point the PMOS transistor 30 becomes important. If the signal received at the gate of the PMOS transistor sleepp is low, then transistor 30 will want to switch on. It will not be switched on when the NMOS transistor 10 is conducting as at this point the voltage across this transistor between its drain and source is not sufficient for it to be turned on. However, as virtual Vvss floats up at a certain point it will float above the threshold voltage Vt of transistor 30 and transistor 30 will turn on. In this way transistor 30 will clamp virtual Vvss at an intermediate voltage Vt, which is between the voltage levels of the two voltage rails and depends on the threshold voltage of the PMOS transistor 30 and the leakage through logic 20.

When the sleepp signal input to the gate of transistor 30 goes high this turns PMOS transistor 30 off and thus there is a large resistance between the lower voltage rail Vss and core logic 20 and thus the virtual voltage Vvss floats high towards the higher voltage level Vdd. The closeness of Vvss to Vdd depends on the resistance across the logic 20 and transistor 10 when they are turned off. The resistance across transistor 10 is generally high so that the voltage Vvss floats to approximately that of Vdd.

Figure 3:
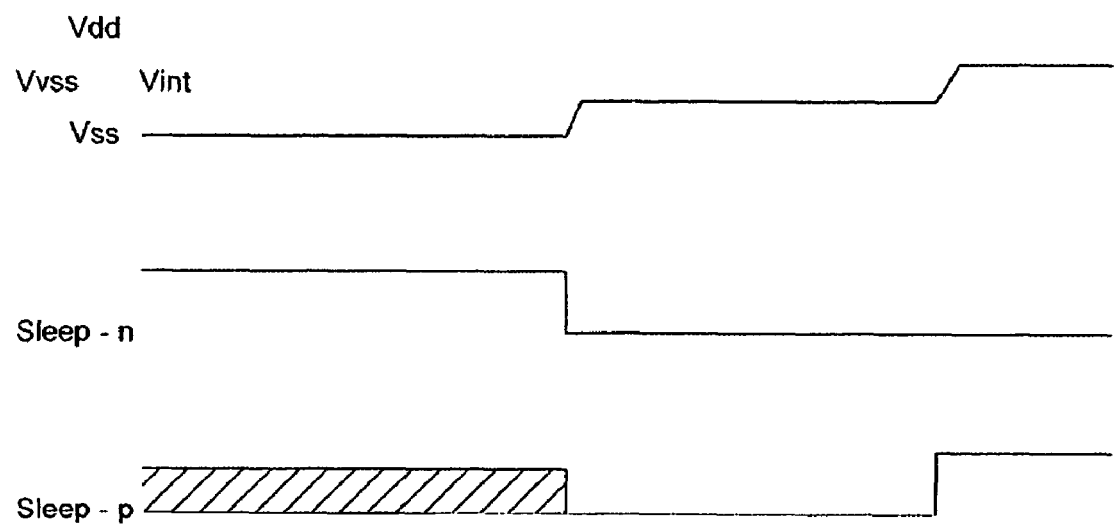
FIG. 3 shows signal and voltage transitions of the circuit illustrated in FIG. 2.

FIG. 3 shows the sleep signals received at the input of the two transistor 10, 30 and the corresponding intermediate voltage level Vvss that is produced in response to the signals. As can be seen when sleepn is high power transistor 10 is conducting and the virtual Vvss is held low at approximately Vss, this is active mode. During this time the level of sleepp is unimportant and this is shown by the hashing in the figure. When sleepn drops low the power transistor 10 is turned off. At the point that sleepn transitions if sleepp the input signal to transistor 30 is low then transistor 30 will act to clamp the output voltage of the two transistors Vvss at an intermediate value Vt which depends on the threshold value of transistor 30. Thus, selection of transistor 30 allows one to choose a suitable intermediate voltage value. This mode is pseudo sleep mode of the core logic 20 and allows power loss to be reduced as the voltage drop across the core logic is reduced. However, the intermediate voltage level is selected such that it is sufficient to prevent or at least inhibit data loss from core logic 20. Thus, in this mode the state of core logic 20 should not be lost. This pseudo sleep mode is useful when the processor is sleeping for a short period and/or a quick wake up time is required, and data needs to be retained. It should be noted that there is some loss of power through transistor 30 which is turned on. However, this is several times smaller than the power loss that is experienced in active mode within power transistor 10 is turned on.

Full sleep mode is entered when sleepp signal goes high and sleepn signal is low. At this point both transistors 10, 30 are turned off and intermediate voltage Vvss floats high towards the voltage rail of Vdd. At this point static power loss is very small, however, the state of the core logic 20 will be lost.

Figure 4:
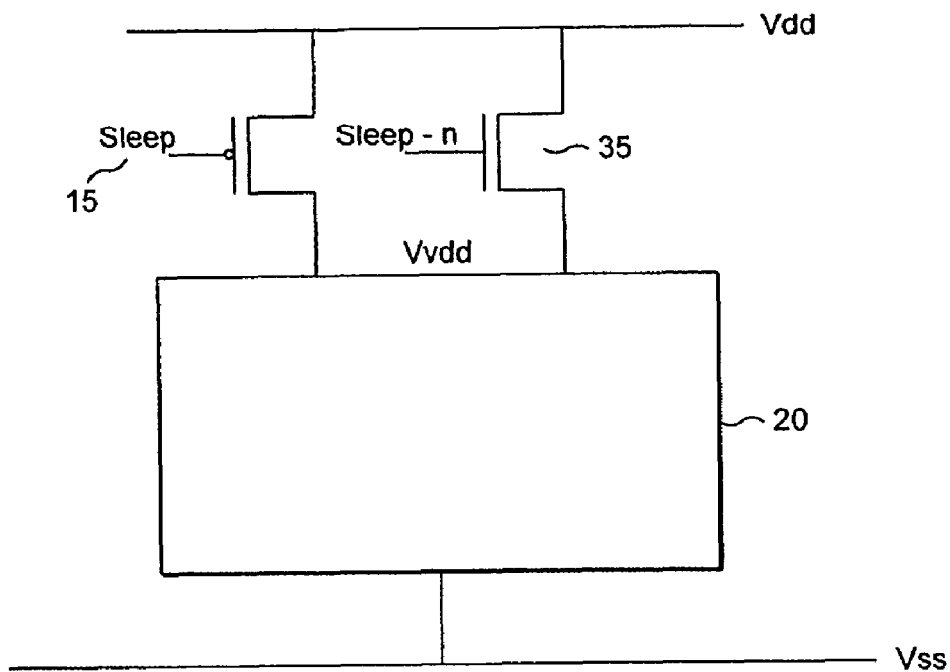
FIG. 4 shows a voltage level control device according to a second embodiment of the present invention.

FIG. 4 shows a voltage control device according to a second embodiment of the present invention. In this embodiment a PMOS power transistor 15 is placed between the higher voltage rail Vdd and the core logic 20. Selection of the type of power transistor to be used, whether it be for example, NMOS or PMOS depends on the core logic and the processes being used. In general NMOS transistors are stronger, having a lower resistance than PMOS transistors and thus can be built to be smaller and are generally preferred. However, although a smaller resistance is helpful in maintaining a large voltage drop across the logic in active mode when the power transistor is turned on, it has some disadvantages when the power transistor is turned off as this smaller resistance will result in a higher leakage current at this point. In this embodiment where a PMOS power transistor 15 is used, then an additional NMOS transistor 35 is placed in parallel with this power transistor 15 to produce a voltage control device according to the second embodiment of the invention.

Within this embodiment, when the sloop signal input to the gate of power transistor 15 is low, power transistor 15 is turned on and the voltage at its drain Vvdd is held at a level approximating that of the high voltage rail itself Vdd. Thus, a virtual Vvdd approximately equal to that of the higher voltage rail is provided to core logic 20 and the circuit is switched on. In this state it is unimportant what signal is input to transistor 35.

When sleep signal goes high, then transistor 35 becomes important. When the sleep signal is high and the sleepn signal input to NMOS transistor 35 is also high this transistor wants to switch on but can not initially as there is insufficient voltage drop across the gate and source of the transistor to allow to it to conduct. However, once power transistor 15 is switched off the output voltage of this transistor Vvdd will start to float low. When the virtual intermediate Vvdd reaches the threshold voltage of transistor 35 it can conduct and thus, it will clamp the virtual Vvdd voltage at this value.

When sleepn drops low and dot sleep signal is high both transistors 15, 35 are switched off and the virtual voltage Vvdd will float towards ground Vss and there will be little power drop across core logic 20 and the circuit will be powered off.

Figure 5:
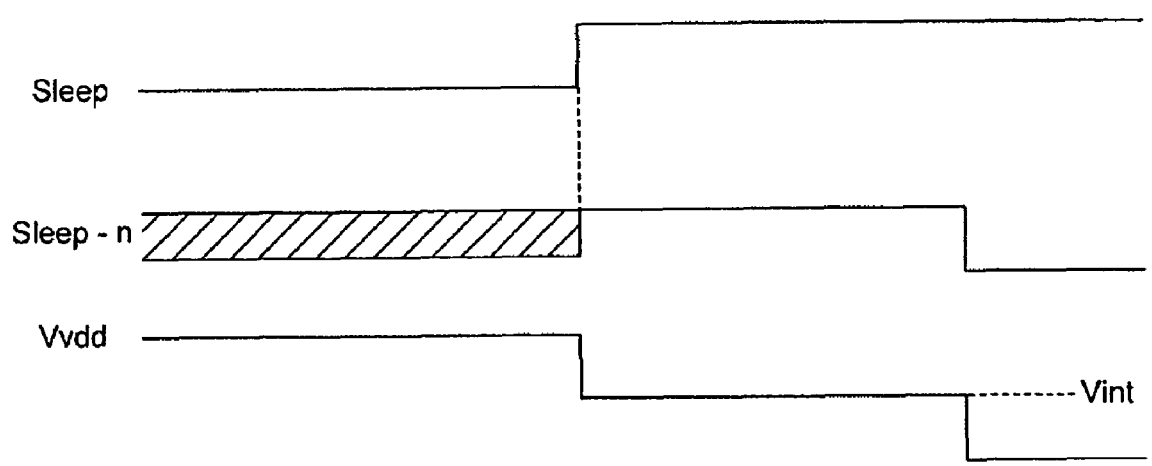
FIG. 5 shows signals and voltage levels of the circuit of FIG. 4.

FIG. 5 shows the voltage levels and the signal levels of the circuit in FIG. 4. As can be seen from this figure when the sleep signal is low power transistor 15 is switched on and the intermediate voltage is hold virtually at the level of the high voltage rail thus, Vvdd is approximately equal to that of the Vdd and there is a substantial voltage differential across core logic 20 and the circuit is switched on. In order for core logic to see most of the voltage differential, it is advantageous if the resistance of the power transistor is low when it is on. During this time it is unimportant what value the sleepn signal has and this is shown by the hashing in the figure.

When the sleep signal goes high the power transistor 15 is turned off and then transistor 35 becomes important. When sleepn signal input to transistor 35 is high the intermediate voltage Vvdd will start to float towards the value of the lower voltage rail Vss, but when it reaches the threshold value of transistor 35 it will be clamped by this transistor and thus it is held at an intermediate voltage determined by the threshold voltage of the switching device transistor 35. This intermediate voltage can be selected to provide sufficient voltage for the state of the core logic not to be lost, while significantly reducing any static power leakage. This state is pseudo sleep mode.

When the sleep signal is high and sleepn is low both transistors 15, 35 are switched off. Thus, the intermediate voltage level Vvdd floats towards that of the ground rail, thus there is very little voltage drop across core logic 20 and it is powered off. This is sleep mode. In sleep mode the state of core logic is lost, however, there is virtually no power loss.

Figure 6:
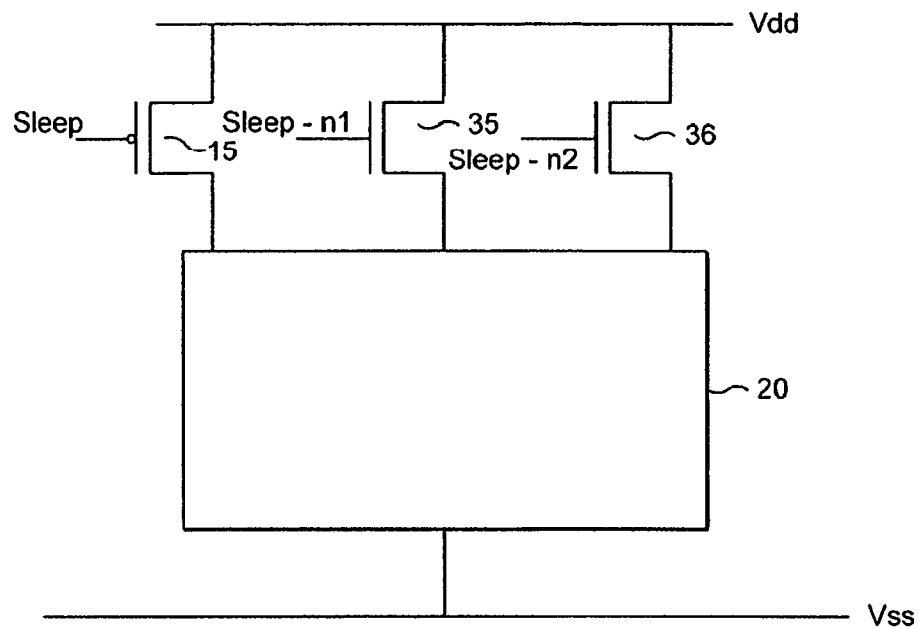
FIG. 6 shows a voltage level control device operable to output four different voltage level.

FIG. 6 shows an embodiment similar to that of FIG. 4, except that in this embodiment there are two transistors 35 and 36 placed in parallel to the power transistor 15. These two transistors have individual sleep signal inputs sleep-n1 and sleep-n2 and are arranged to have different threshold voltages in order to produce intermediate voltages of different sizes. In the embodiment illustrated, transistor 35 is a HVT device while transistor 36 is a LVT device. An arrangement such as this allows two different intermediate voltages to be selected by asserting either sleep-n1 or sleep-n2, the value of the intermediate voltage being determined by the threshold voltages of the transistors.

Clearly any number of switching circuits could be arranged in parallel with a resulting number of different intermediate voltages being possible.

Figure 7:
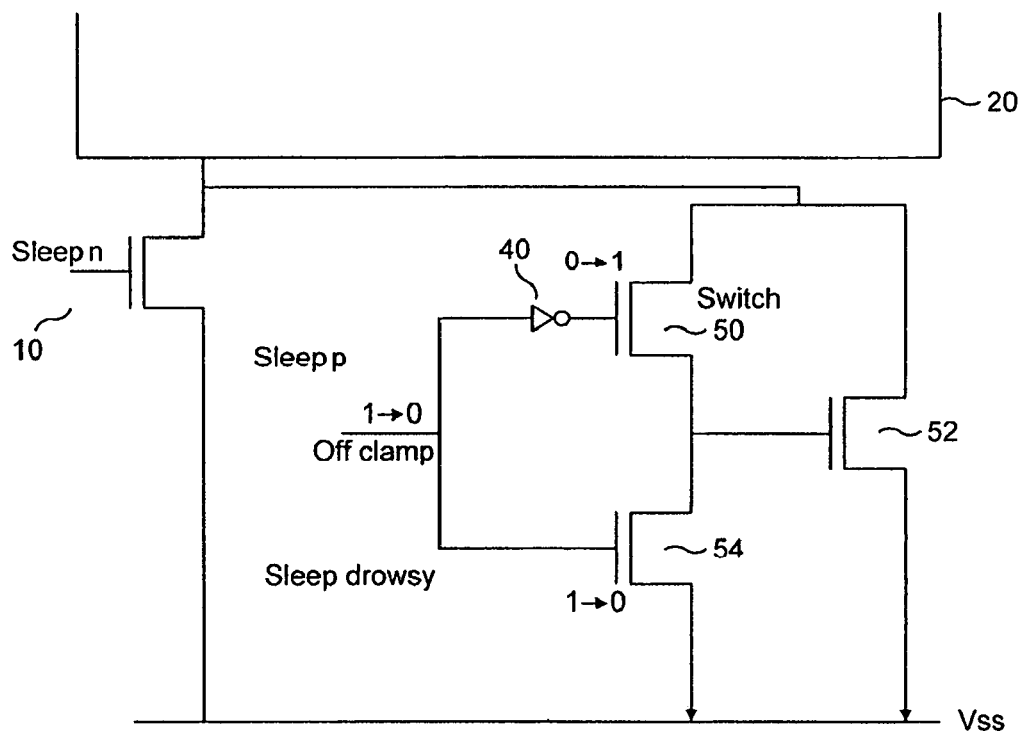
FIG. 7 shows a voltage level control device according to a further embodiment of the present invention.

FIG. 7 shows an alternative embodiment of the present invention. In this embodiment power transistor 10 has a plurality of circuit elements in parallel with it. These plurality of circuit elements, comprise an inverter 40 and three NMOS transistors 50, 52, 54 form the switching device. They replace the PMOS transistor 30 of the circuit of FIG. 2, and have the same functionality. Thus, when sleepp is high, the switching circuit is off and its resistance is high. When sleepp falls low, the circuit wants to turn on mid when Vvss floats above the threshold voltage of the elements of the switching device it turns on and clamps Vvss at the threshold voltage of the switching device. The choice of circuit elements is made such that a suitable intermediate voltage is provided to the core logic during pseudo sleep or drowsy mode. It should be understood by a skilled person that the switching device in parallel with the power transistor can be made from a number of different circuit elements provided that functionally it is able to produce, in conjunction with the power transistor, three voltage level outputs operable to allow the core logic three different states, a sleep state, a pseudo sleep state and an active state.

Although particular embodiments have been described herein, it will be appreciated that the invention is not limited thereto and that many modifications and additions thereto may be made within the scope of the invention. For example, various combinations of the features of the following dependent claims can be made with the features of the independent claims without departing from the scope of the present invention.

I claim:

1. A voltage level control device for controlling a voltage level supplied from a first voltage level source to circuitry, said voltage level supplied having one of at least four voltage levels, said circuitry being arranged between said first voltage level source and a second voltage level source, said first and second voltage level sources being operable to output different voltage levels; said voltage level control device comprising:

a power transistor connected between said first voltage level source and said circuitry, said power transistor comprising a sleep signal input operable to receive a sleep signal;

at least two switching devices connected in parallel with said power transistor and comprising at least two sleep signal inputs operable to receive at least two pseudo sleep signals;

said voltage level control device is responsive to said sleep signal and said at least two pseudo sleep signals to output to said circuitry an output voltage said output voltage comprising one of said at least four voltage levels, said at least four voltage levels lying between voltage levels output by said first and second voltage sources;

said at least four voltage levels comprise a first voltage level substantially equal to or approaching said voltage level of said first voltage source; a second voltage level substantially equal to or approaching said voltage level of said second voltage source; and at least two intermediate voltage levels, said at least two intermediate voltage levels lying between said first and second voltage levels;

wherein said voltage level control device is responsive to
said sleep signal having a first predetermined value to turn said power transistor on and to output said first voltage level, and
said sleep signal having a second predetermined value to turn said power transistor off and
in response to said first and second pseudo sleep signals having first predetermined values to turn said two corresponding switching devices off and to output said second voltage level; and
in response to said first pseudo sleep signal having a further predetermined value and following a voltage across a corresponding first switching device reaching a threshold value of said first switching device to turn said first switching device on and to output said first intermediate voltage level;
in response to said second pseudo sleep signal having a further predetermined value and following a voltage across a corresponding further switching device reaching a threshold value of said further switching device to turn said further switching device on and to output a second intermediate voltage level.

2. A voltage level control device according to claim 1, wherein said power transistor is an NMOS transistor and said first voltage level source is lower than said second voltage level.

3. A voltage level control device according to claim 2, wherein one of said at least one switching devices comprises a PMOS transistor, said at least one intermediate voltage depending on said threshold voltage of said PMOS transistor.

4. A voltage level control device according to claim 1, wherein said power transistor is a PMOS transistor and said first voltage level source is higher than said second voltage level.

5. A voltage level control device according to claim 4, wherein one of said at least one switching devices comprises an NMOS transistor, said intermediate voltage depending on said threshold value of said NMOS transistor.

6. A voltage level control device according to claim 1, wherein said at least one switching device comprises at least one of the following a thick oxide, LVT, NVT and a HVT device.

7. A voltage level control device according to claim 1, wherein said switching device comprises a plurality of transistors.

8. A voltage level control device according to claim 1, wherein said circuitry comprises CMOS circuitry.

9. A method of controlling a voltage level supplied from a first voltage level source to circuitry, said voltage level supplied being controlled to have one of at least four levels, said circuitry being arranged between said first voltage level source and a second voltage level source, said first and second voltage level sources being operable to output different voltage levels, said method comprising:
connecting a power transistor between said first voltage level source and said circuitry, said power transistor having a sleep signal input operable to receive a sleep signal;
connecting at least two switching devices in parallel with said power transistor, said at least two switching devices having at least two sleep signal inputs operable to receive respective at least two pseudo sleep signals;
outputting an output voltage to said circuitry in dependence upon said sleep signal and said at least two pseudo sleep signals, said output voltage comprising one of at least four voltage levels, said at least four voltage levels lying between voltage levels output by said first and second voltage sources and comprising:
a first voltage level substantially equal to or approaching said voltage level of said first voltage source;
a second voltage level substantially equal to or approaching said voltage level of said second voltage source;
at least two intermediate voltage levels, said at least two intermediate voltage levels lying between said first and second voltage levels, and
wherein said step of outputting an output voltage comprises one of the following steps:
inputting a sleep signal having a first predetermined value to said power transistor such that said power transistor is turned on and outputting a first voltage difference to said circuitry;
inputting a sleep signal having a second predetermined value to said power transistor such that said power transistor is turned off and inputting a predetermined value to said at least two switching devices such that said at least two switching devices are turned off and outputting a second voltage difference to said circuitry;
inputting a sleep signal having said second predetermined value to said power transistor such that said power transistor is turned off and inputting a further predetermined value to a first one of said at least two switching devices such that said switching device is turned on and outputting a first intermediate voltage level; and
inputting a sleep signal having said second predetermined value to said power transistor such that said power transistor is turned off and inputting a further predetermined value to a second one of said at least two switching devices such that said second one of said at least two switching devices is turned on and outputting a second intermediate voltage level.

10. A method according to claim 9, wherein said power transistor is an NMOS transistor and said first voltage level source is lower than said second voltage level.

11. A method according to claim 10, wherein one of said at least one switching device comprises a PMOS transistor, one of said at least one intermediate voltages depending on said threshold voltage of said PMOS transistor.

12. A method according to claim 9, wherein said power transistor is a PMOS transistor and said first voltage level source is higher than said second voltage level.

13. A method according to claim 12, wherein one of said at least one switching device comprises an NMOS transistor, one of said at least one intermediate voltage depending on said threshold value of said NMOS transistor.

14. A method according to claim 9, wherein said at least one switching device comprises at least one of the following a thick oxide, LVT, NVT and HVT device.

15. A method according to claim 9, wherein said at least one switching device comprises a plurality of transistors.

16. A method according to claim 9, wherein said circuitry comprises CMOS circuitry.

17. A means for controlling a voltage level supplied from a first means for supplying a voltage level to circuitry, said voltage level supplied being controlled to have one of at least four levels, said circuitry being arranged between said first means for supplying a voltage level and a second means for supplying a voltage level, said first and second means for supplying a voltage level being operable to output different voltage levels; said means for controlling a voltage level comprising:

a power transistor connected between said first means for supplying a voltage level and said circuitry, said power transistor comprising a sleep signal input operable to receive a sleep signal;

at least two means for switching connected in parallel with said power transistor and comprising at least two sleep signal inputs for receiving at least two pseudo sleep signals; wherein said means for controlling a voltage level is responsive to said sleep signal and said at least two pseudo sleep signals to output to said circuitry an output voltage comprising one of at least four voltage levels, said at least four voltage levels lying between voltage levels output by said first and second means for supplying a voltage level; wherein said at least four voltage levels comprise a first voltage level substantially equal to or approaching said voltage level of said first means for supplying a voltage; a second voltage level substantially equal to or approaching said voltage level of said second means for supplying a voltage; and at least two intermediate voltage levels, said at least two intermediate voltage levels lying between said first and second voltage levels;

wherein said means for controlling a voltage level is responsive to said sleep signal having a first predetermined value to turn said power transistor on and to output said first voltage level, and said sleep signal having a second predetermined value to turn said power transistor off and in response to said first and second pseudo sleep signals having a predetermined values to turn said two of said at least two meand for switching off and to output said second voltage level; and in response to said first pseudo sleep signal having a further predetermined value and following a voltage across a first of said at least two means for switching reaching a threshold value of said first means for switching and to output said first intermediate voltage level;

in response to said second pseudo sleep signal having a further predetermined value and following a voltage across a further means for switching reaching a threshold value of said further means for switching to turn said further means for switching on and to output a second intermediate voltage level.

* * * * *